(12) United States Patent
Zhu et al.

(10) Patent No.: US 12,250,777 B2
(45) Date of Patent: Mar. 11, 2025

(54) METHOD FOR MANUFACTURING PRINTED CIRCUIT BOARD WITH ELECTRONIC COMPONENT, AND PRINTED CIRCUIT BOARD WITH ELECTRONIC COMPONENT

(71) Applicant: MEKTEC CORPORATION, Tokyo (JP)

(72) Inventors: Jiang Zhu, Tokyo (JP); Shota Obuchi, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 80 days.

(21) Appl. No.: 17/835,798

(22) Filed: Jun. 8, 2022

(65) Prior Publication Data

US 2023/0045335 A1 Feb. 9, 2023

(30) Foreign Application Priority Data

Aug. 3, 2021 (JP) ................................. 2021-127288

(51) Int. Cl.
*H05K 3/28* (2006.01)
*H05K 1/18* (2006.01)

(52) U.S. Cl.
CPC ............. *H05K 3/28* (2013.01); *H05K 1/181* (2013.01)

(58) Field of Classification Search
CPC .................. H05K 1/181; H05K 1/182; H05K 2201/09872; H05K 2201/10977; H05K 2203/1476; H05K 3/28; H05K 3/284; H05K 3/3447
See application file for complete search history.

(56) References Cited

U.S. PATENT DOCUMENTS

| | | | | |
|---|---|---|---|---|
| 4,055,725 A * | 10/1977 | Boynton | ............... | H05K 3/305 361/748 |
| 4,478,673 A * | 10/1984 | Plocher | ................... | B30B 7/023 414/277 |
| 4,698,192 A * | 10/1987 | Kuze | ..................... | C04B 41/009 101/232 |
| 5,442,142 A * | 8/1995 | Hayashi | ............... | H01R 12/523 174/250 |
| 5,639,989 A * | 6/1997 | Higgins, III | .......... | H01L 23/552 174/394 |
| 6,000,124 A * | 12/1999 | Saito | ..................... | H05K 3/4638 29/721 |
| 6,401,001 B1 * | 6/2002 | Jang | ...................... | B33Y 50/02 204/192.15 |
| 6,498,319 B1 * | 12/2002 | Matsumoto | ........... | H01L 21/481 219/121.72 |
| 9,327,452 B2 * | 5/2016 | Mark | ...................... | B29C 64/40 |
| 9,485,870 B2 * | 11/2016 | Mayo | ..................... | H05K 3/284 |

(Continued)

FOREIGN PATENT DOCUMENTS

JP 2015-133394 A 7/2015

*Primary Examiner* — Timothy J Thompson
*Assistant Examiner* — Rhadames Alonzo Miller
(74) *Attorney, Agent, or Firm* — Studebaker Brackett PLLC (57) ABSTRACT

Provided is a method for manufacturing a printed circuit board with electronic component, including: mounting an electronic component on an insulating substrate; applying an insulating first coating resin to at least a part of the electronic component; curing the first coating resin; applying an insulating second coating resin to the cured first coating resin; and curing the second coating resin.

10 Claims, 7 Drawing Sheets

(56) References Cited

U.S. PATENT DOCUMENTS

| | | | | |
|---|---|---|---|---|
| 9,545,043 B1* | 1/2017 | Hamilton | | H01L 23/295 |
| 10,016,942 B2* | 7/2018 | Mark | | B29C 64/106 |
| 10,076,876 B2* | 9/2018 | Mark | | B29C 48/92 |
| 10,099,427 B2* | 10/2018 | Mark | | B29C 64/106 |
| 10,568,215 B1* | 2/2020 | Shpitzer | | H05K 3/284 |
| 10,953,610 B2* | 3/2021 | Mark | | B29C 64/209 |
| 11,148,409 B2* | 10/2021 | Mark | | B29C 64/118 |
| 2001/0023532 A1* | 9/2001 | Fujii | | H01L 21/4857 |
| | | | | 29/830 |
| 2002/0129951 A1* | 9/2002 | Babb | | H01L 23/552 |
| | | | | 174/370 |
| 2002/0162628 A1* | 11/2002 | Yamasaki | | B32B 38/0004 |
| | | | | 156/701 |
| 2004/0145858 A1* | 7/2004 | Sakurada | | H05K 3/4664 |
| | | | | 361/600 |
| 2004/0226745 A1* | 11/2004 | En | | H05K 3/423 |
| | | | | 174/262 |
| 2005/0095410 A1* | 5/2005 | Mazurkiewicz | | H05K 9/0039 |
| | | | | 428/209 |
| 2005/0153249 A1* | 7/2005 | Yamaguchi | | H05K 3/102 |
| | | | | 430/319 |
| 2007/0065639 A1* | 3/2007 | Iida | | G03G 15/6591 |
| | | | | 428/141 |
| 2007/0171078 A1* | 7/2007 | Cotton | | G06K 19/0723 |
| | | | | 700/225 |
| 2007/0248798 A1* | 10/2007 | Tsuruoka | | H05K 3/125 |
| | | | | 428/457 |
| 2009/0085706 A1* | 4/2009 | Baarman | | H01F 5/003 |
| | | | | 336/200 |
| 2009/0098478 A1* | 4/2009 | Ryu | | H05K 3/428 |
| | | | | 430/258 |
| 2009/0244878 A1* | 10/2009 | Wurzel | | H05K 9/0024 |
| | | | | 361/818 |
| 2011/0189381 A1* | 8/2011 | Boday | | B32B 27/30 |
| | | | | 428/463 |
| 2012/0250275 A1* | 10/2012 | Yamamoto | | H01L 24/83 |
| | | | | 29/829 |
| 2013/0181110 A1* | 7/2013 | Sievers | | H01L 31/022408 |
| | | | | 250/206 |
| 2014/0098505 A1* | 4/2014 | Baker | | H05K 3/284 |
| | | | | 29/841 |
| 2014/0202743 A1* | 7/2014 | Kim | | H05K 1/028 |
| | | | | 174/254 |
| 2014/0362535 A1* | 12/2014 | Meier | | H01L 23/4985 |
| | | | | 361/761 |
| 2015/0062825 A1* | 3/2015 | Ossimitz | | H01L 23/4006 |
| | | | | 29/841 |
| 2015/0197642 A1* | 7/2015 | Boday | | C09D 7/67 |
| | | | | 427/96.4 |
| 2015/0223344 A1* | 8/2015 | Lazaro Gallego | | H05K 13/0069 |
| | | | | 29/760 |
| 2015/0282329 A1* | 10/2015 | Baker | | H05K 3/288 |
| | | | | 264/261 |
| 2016/0165727 A1* | 6/2016 | Liskow | | H05K 5/0082 |
| | | | | 29/829 |
| 2016/0375596 A1* | 12/2016 | Broemse | | B26B 21/48 |
| | | | | 29/843 |
| 2017/0006699 A1* | 1/2017 | Mizutani | | H05K 3/4038 |
| 2017/0154707 A1* | 6/2017 | Abe | | B29C 48/154 |
| 2018/0134025 A1* | 5/2018 | Nakashima | | B29C 66/91933 |
| 2020/0163802 A1* | 5/2020 | Hunt | | H01L 23/3135 |
| 2021/0358288 A1* | 11/2021 | Boumenir | | G08B 21/18 |

* cited by examiner

METHOD FOR MANUFACTURING PRINTED CIRCUIT BOARD WITH ELECTRONIC COMPONENT, AND PRINTED CIRCUIT BOARD WITH ELECTRONIC COMPONENT

CROSS-REFERENCE TO RELATED APPLICATION

This application claims priority from Japanese Patent Application No. 2021-127288 filed with the Japan Patent Office on Aug. 3, 2021, the entire content of which is hereby incorporated by reference.

BACKGROUND

1. Technical Field

The present disclosure relates to a method for manufacturing a printed circuit board with electronic component, and the printed circuit board with electronic component.

2. Related Art

JP-A-2015-133394 discloses a method for manufacturing a printed circuit board including a base film, an electronic component mounted on the base film, a protective film coating at least a part of the electronic component, an insulating layer laminated on a non-mounting region of the electronic component in the base film, and a recessed groove formed on a surface of the insulating layer. In a coating step of coating at least the part of the electronic component in JP-A-2015-133394 with the protective film, outflow of a coating resin before curing is restricted by the recessed groove.

SUMMARY

A method for manufacturing a printed circuit board with electronic component, according to the present disclosure, includes: mounting an electronic component on an insulating substrate; applying an insulating first coating resin to at least a part of the electronic component; curing the first coating resin; applying an insulating second coating resin to the cured first coating resin; and curing the second coating resin.

BRIEF DESCRIPTION OF THE DRAWINGS

FIGS. 1A and 1B are views illustrating an electronic component and its peripheral structure in a first embodiment.

FIGS. 2A, 213, and 2C are cut end views for explaining a method for manufacturing a printed circuit board with electronic component according to the first embodiment;

FIGS. 4A and 4B are views illustrating the electronic component and its peripheral structure in a second embodiment.

FIGS. 5A, 513, and 5C are cut end views for explaining the method for manufacturing the printed circuit board with electronic component according to the second embodiment;

FIGS. 7A and 7B are views illustrating the electronic component and its peripheral structure in a modification of the second embodiment.

DETAILED DESCRIPTION

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In a method for manufacturing a printed circuit board with electronic component, it is desired to more easily form a coating resin layer within a desired thickness and range.

The present disclosure relates to the method for manufacturing the printed circuit board with electronic component, which makes it easier to form the coating resin layer within the desired thickness and range, and the printed circuit board with electronic component.

A method for manufacturing a printed circuit board with electronic component, according to one aspect of the present disclosure, includes: mounting an electronic component on an insulating substrate; applying an insulating first coating resin to at least a part of the electronic component; curing the first coating resin; applying an insulating second coating resin to the cured first coating resin; and curing the second coating resin.

A printed circuit board with electronic component, according to one aspect of the present disclosure, includes: an insulating substrate; an electronic component mounted on the substrate; and an insulating coating resin layer. The coating resin layer has a main portion covering at least a part of the electronic component and a sub-portion arranged around the main portion. A film thickness of the main portion is larger than that of the sub-portion, and there is a step at a boundary between the main portion and the sub-portion.

According to the present disclosure, it is easier to form the coating resin layer within the desired thickness and range.

Hereinafter, embodiments of the present disclosure will be described with reference to the drawings. Note that in all the drawings, the same components are denoted by the same reference numerals, and description thereof will be omitted as appropriate.

First Embodiment

First, a first embodiment will be described with reference to FIGS. 1A to 3C.

As illustrated in FIGS. 1A to 3C, the method for manufacturing the printed circuit board with electronic component according to the present embodiment (hereinafter, may be referred to as this method) is a method for manufacturing a printed circuit board 100 with electronic component including an insulating substrate 10, an electronic component 30 mounted on the insulating substrate 10, and an insulating coating resin layer 20 coating at least a part of the electronic component 30.

In this method, a mounting step of mounting the electronic component 30 on the substrate 10, and a coating step of coating at least the part of the electronic component 30 with the coating resin layer 20 are performed in this order.

The coating step includes a first coating step of applying a coating resin to at least the part of the electronic component 30, a first curing step of curing the coating resin applied in the first coating step, a second coating step of further applying the coating resin to the coating resin cured in the first curing step, and a second curing step of curing the coating resin applied in the second coating step.

In the following description, the coating resin cured in the first curing step may be referred to as a first coating resin layer, and the coating resin cured in the second curing step may be referred to as a second coating resin layer.

That is, the coating resin layer 20 coating at least the part of the electronic component 30 has a structure in which the second coating resin layer is laminated on the first coating resin layer.

In the printed circuit board 100 with electronic component, from the viewpoint of protecting the electronic component 30 from dust, moisture, physical impact, and the like, a film thickness of the insulating coating resin layer 20 coating at least the part of the electronic component 30 is preferably thick.

Here, a resin material used as the coating resin has a characteristic that wettability (spreadability) with respect to a cured coating resin is lower than the wettability (spreadability) with respect to a material constituting the substrate 10.

In this method, in the second coating step, the coating resin is further applied to the coating resin (first coating resin layer) cured in the first curing step. Therefore, it is possible to restrain the coating resin applied in the second coating step from spreading over a wide range on a surface of the coating resin (first coating resin layer) cured in the first curing step. Thus, the film thickness of the coating resin layer 20 including the first coating resin layer and the second coating resin layer can be easily increased.

Furthermore, since the coating resin applied in the second coating step can sufficiently secure the film thickness of the coating resin layer 20, an amount of the coating resin applied in the first coating step can be further reduced. Thus, a formation range of the coating resin layer 20 can be minimized.

As described above, according to this method, it is easier to form the coating resin layer 20 within the desired thickness and range.

Further, according to this method, even when a low viscosity coating resin, which is cheaper than a high viscosity coating resin, is used, the film thickness of the coating resin layer 20 can be easily increased, and thus the material cost can be further reduced.

Further, according to the present disclosure, by adjusting the amount of the coating resin to be applied without using a dedicated jig for restricting the formation range of the coating resin layer 20, the coating resin can be thickly applied within a desired range. Therefore, since it is not necessary to consider the shape and dimensions of the jig, the shape and dimensions of the printed circuit board 100 with electronic component can be set with a higher degree of freedom.

Hereinafter, an example of a structure of the printed circuit board 100 with electronic component manufactured according to the present embodiment will be described with reference to FIGS. 1A and 1B.

Figure 1A:
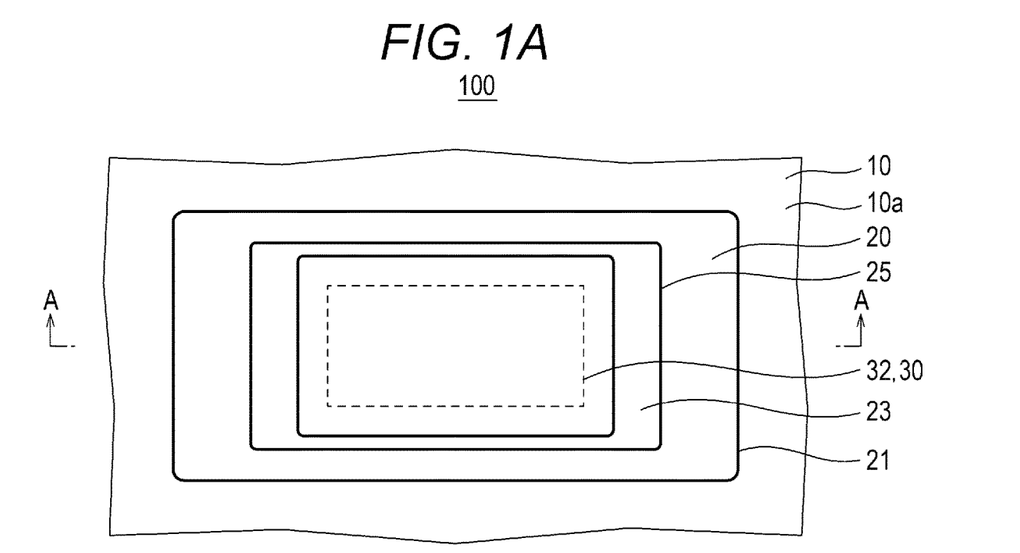
FIG. 1A is a plan view.
Figure 1B:
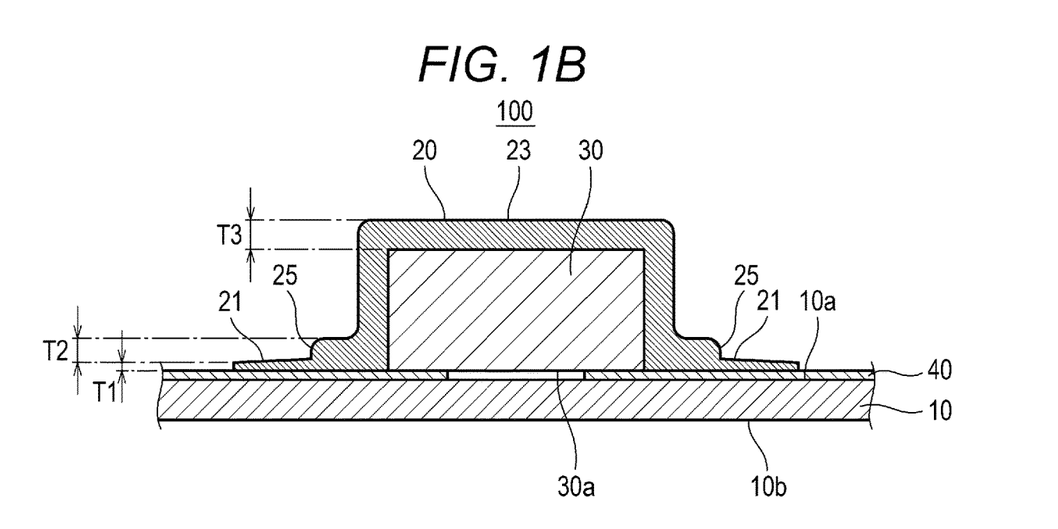
FIG. 1B is a cut end view taken along line A-A illustrated in FIG. 1A.

Note that in the following, when explaining, for example, a positional relationship between components of the printed circuit board 100 with electronic component, an upper side in FIG. 1B is referred to as an upper side or above, and the opposite side is referred to as a lower side or below. However definitions of these directions are for convenience, and do not limit directions at the time of manufacturing and the time of using the printed circuit board 100 with electronic component.

As an example, the printed circuit board 100 with electronic component is incorporated in a voltage monitoring module (not illustrated) and used for monitoring voltage. In that case, a conductor pattern 40 of the printed circuit board 100 with electronic component is connected to a bus bar (not illustrated) connecting a plurality of battery cells (not illustrated).

In more detail, for example, a connector (not illustrated) is attached to the printed circuit board 100 with electronic component. By connecting the printed circuit board 100 with electronic component to a measuring device that performs various controls via the connector, it is possible to monitor the voltage.

The printed circuit board 100 with electronic component is a laminated body formed flat. A planar shape of the printed circuit board 100 with electronic component is not particularly limited, but as an example, it can be a substantially rectangular shape (for example, a rectangular shape with rounded corners).

The printed circuit board 100 with electronic component may be a flexible printed circuit board (flexible board) or a rigid board.

As described above, the printed circuit board 100 with electronic component according to the present embodiment includes the insulating substrate 10, the electronic component 30 mounted on the insulating substrate 10, and the insulating coating resin layer 20 coating at least the part of the electronic component 30.

The substrate 10 is, for example, a relatively thin substrate having front and back surfaces as main surfaces. In more detail, when the printed circuit board 100 with electronic component is the flexible printed circuit board, the substrate 10 is formed, for example, in a film shape. When the printed circuit board 100 with electronic component is the rigid substrate, the substrate 10 is formed, for example, in a flat plate shape.

The substrate 10 is made of an insulating and thermoplastic resin material, and is made of polyimide in the present embodiment. However, the material of the substrate 10 is not limited to this example, and for example, polyethylene terephthalate (PET), polyethylene naphthalate (PEN), liquid crystal polymer (LCP), fluorine-based resin (polytetra fluoroethylene: PTFE), or a resin material containing them may be used.

In the case of the present embodiment, the electronic component 30 is a square surface mount component. The electronic component 30 is surface-mounted on one surface 10a of the substrate 10.

In more detail, a conductor pattern 40 (see FIG. 1B) is formed on the one surface 10a of the substrate 10, and the conductor pattern 40 is electrically connected to the electronic component 30. Note that in FIG. 1A, the conductor pattern 40 is not illustrated.

The conductor pattern 40 is formed by processing a copper foil. The electronic component 30 is mounted on one end in an extending direction of the conductor pattern 40. The electronic component 30 is joined to the one end of the conductor pattern 40, for example, by solder (not illustrated), and is electrically connected to the conductor pattern 40.

The square surface mount component is not particularly limited, but is, for example, a semiconductor chip, a ceramic capacitor, a resistor, or the like.

The coating resin is not particularly limited, and is, for example, acrylic, silicone, phenol, epoxy and the like. Further, as the coating resin, for example, it is also preferable to use an ultraviolet curable resin material, and it is particularly preferable to use the ultraviolet curable resin material containing an epoxy as a main component and a photocrosslinking agent. When the ultraviolet curable resin material is used, the coating resin can be cured by ultraviolet irradiation. However, the coating resin is not limited to the ultraviolet curable type, and may be, for example, a thermosetting type, a solvent vaporization type, or the like.

In the case of the present embodiment, as illustrated in FIGS. 1A and 1B, the coating resin layer 20 covers the entire electronic component 30. Thus, the coating resin layer 20 can more reliably protect the electronic component 30 from dust, moisture, physical impact, and the like.

In more detail, the coating resin layer 20 covers the entire surface exposed from the substrate 10 of the electronic component 30, and does not cover a surface (one surface 30a) of the electronic component 30 facing the one surface 10a of the substrate 10.

Further, in a plan view, the electronic component 30 is, for example, arranged so that an outline of the electronic component 30 is located in a region inside an outline of the coating resin layer 20.

Furthermore, a part of the coating resin layer 20 coats, for example, a part of the one surface 10a of the substrate 10 and a part of an upper surface of the conductor pattern 40.

As described above, in the case of the present embodiment, in the second coating step, the coating resin is further applied to the coating resin (first coating resin layer) cured in the first curing step. The coating resin layer 20 includes two layers, a first coating resin layer that has been applied in the first coating step and then cured in the first curing step, and a second coating resin that has been applied in the second coating step and then cured in the second curing step.

In more detail, in the case of the present embodiment, the coating resin layer 20 includes a main portion 23 covering at least the part of the electronic component 30, and a sub-portion 21 arranged around the main portion 23.

The sub-portion 21 of the coating resin layer 20 includes one layer made of the first coating resin layer. The main portion 23 of the coating resin layer 20 includes two layers made of the first coating resin layer and the second coating resin layer. Therefore, the film thickness of the main portion 23 is larger than that of the sub-portion 21.

Note that "the film thickness of the main portion 23 is larger than that of the sub-portion 21" means at least that an average value of the film thickness of the main portion 23 is larger than that of the sub-portion 21.

Then, as illustrated in FIG. 1B, a minimum film thickness T3 (see FIG. 1B) of the main portion 23 of the coating resin layer 20 is preferably larger than a maximum film thickness T1 (see FIG. 1B) of the sub-portion 21 of the coating resin layer 20.

Here, in the case of the present embodiment, the coating resin layer 20 has a step 25 (see FIGS. 1A and 1B) at the boundary between the main portion 23 and the sub-portion 21.

In more detail, the step 25 exists at the boundary between the first coating resin layer and the second coating resin layer. Then, in the coating resin layer 20, an inside of the step 25 constitutes the main portion 23, and an outside of the step 25 constitutes the sub-portion 21. Here, the inside is a side closer to the electronic component 30, and the outside is a side away from the electronic component 30.

The presence of the step 25 makes it possible to easily identify whether the second coating step has been performed, based on appearance of the printed circuit board 100 with electronic component.

In the case of the present embodiment, in the coating resin layer 20, the maximum film thickness T1 of the sib-portion 21 is a maximum film thickness of the first coating resin layer. A height 12 of the step 25 (see FIG. 13) is a film thickness of the second coating resin layer. And, the minimum film thickness T3 of the main portion 23 is a thickness obtained by combining the maximum film thickness of the first coating resin layer (maximum film thickness T1 of the sub-portion 21) and the film thickness of the second coating resin layer (height T2 of the step 25).

Note that in the present disclosure, the step 25 does not necessarily have to exist at the boundary between the sub-portion 21 and the main portion 23 of the coating resin layer 20. When the step 25 does not exist, for example, at the boundary between the sub-portion 21 and the main portion 23, the film thickness of the coating resin layer 20 may be gradually reduced from a central portion of the main portion 23 toward the sub-portion 21.

Further, the height T2 of the step 25 is preferably larger than the thickness of the sub-portion 21. By doing so, it is easier to identify whether the second coating step has been performed, based on the appearance of the printed circuit board 100 with electronic component.

Note that "the height T2 of the step 25 is larger than the thickness of the sub-portion 21" means at least that the height T2 of the step 25 is larger than an average value of the film thickness of the sub-portion 21 of the coating resin layer 20. In the case of the present embodiment, the height T2 of the step 25 is larger than the maximum film thickness T1 of the sub-portion 21.

Further, in the case of the present embodiment, as illustrated in FIGS. 1A and 1B, the electronic component 30 is arranged so that the outline of the electronic component 30 is located in a region inside an outline of the main portion 23 of the coating resin layer 20. That is, the entire electronic component 30 (however excluding the one surface 30a) is covered by the main portion 23 having a film thickness larger than that of the sub-portion 21. In more detail, an upper surface and a side peripheral surface of the electronic component 30 are covered by the main portion 23 of the coating resin layer 20.

Thus, the electronic component 30 can be better protected by the coating resin layer 20.

The minimum film thickness of the sub-portion 21 of the coating resin layer 20 is not particularly limited, but is preferably 10 μm or more, for example.

The minimum film thickness T3 of the main portion 23 of the coating resin layer 20 is not particularly limited, but is preferably 40 μm or more, for example.

Figure 2A:
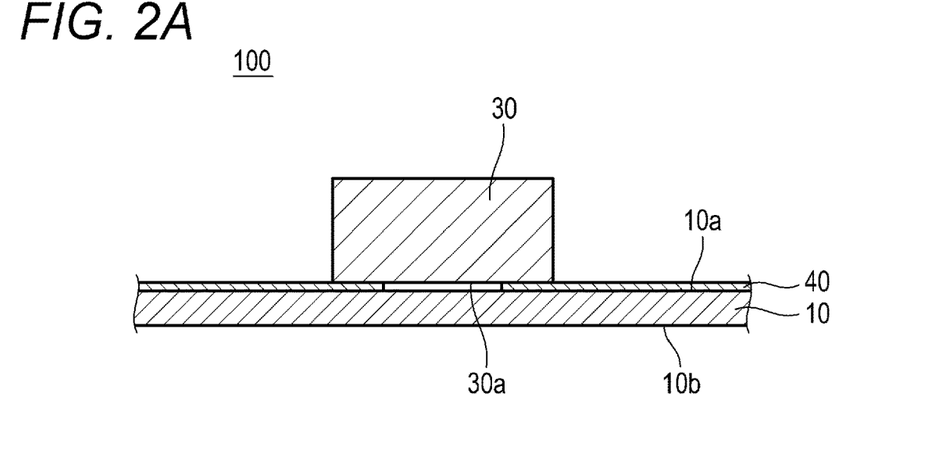
Figure 2B:
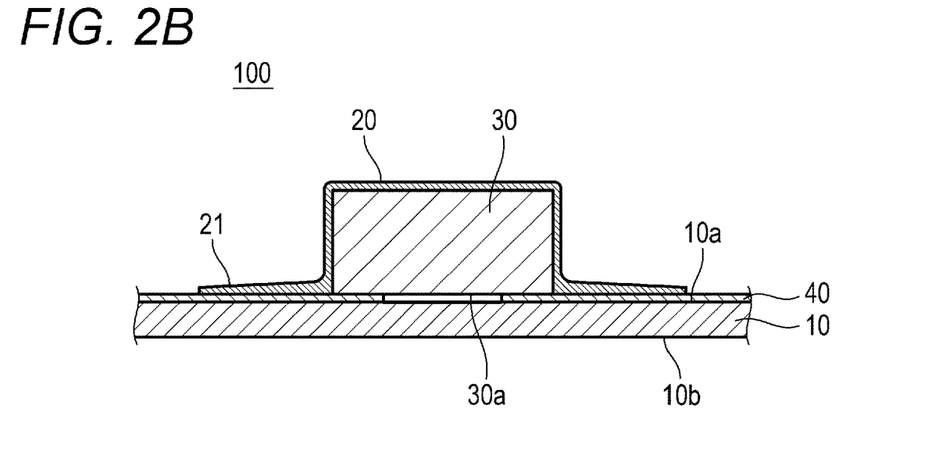
Figure 2C:
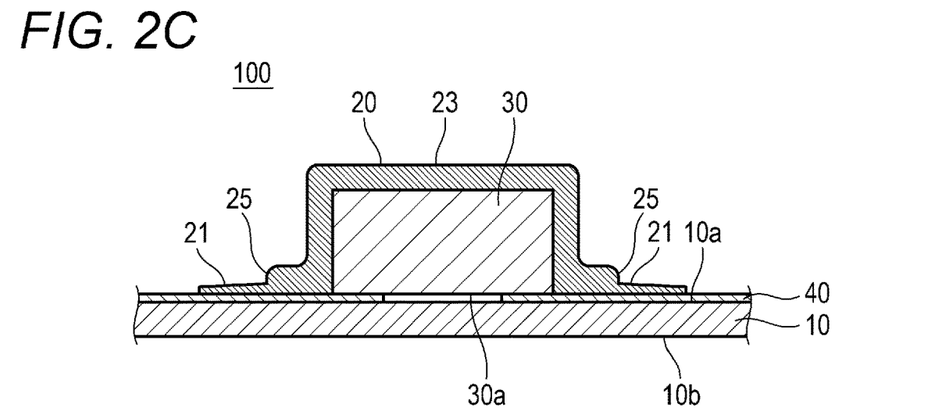

Hereinafter, the method for manufacturing the printed circuit board 100 with electronic component according to the present embodiment will be described in more detail with reference to FIGS. 2A to 3C. Note that FIGS. 2A to 2C are cut end views of a portion corresponding to FIG. 1B.

As described above, in the method for manufacturing the printed circuit board 100 with electronic component according to the present embodiment, the mounting step of mounting the electronic component 30 on the substrate 10, and the coating step of coating at least the part of the electronic component 30 with the coating resin layer 20 are performed in this order.

Figure 3A:
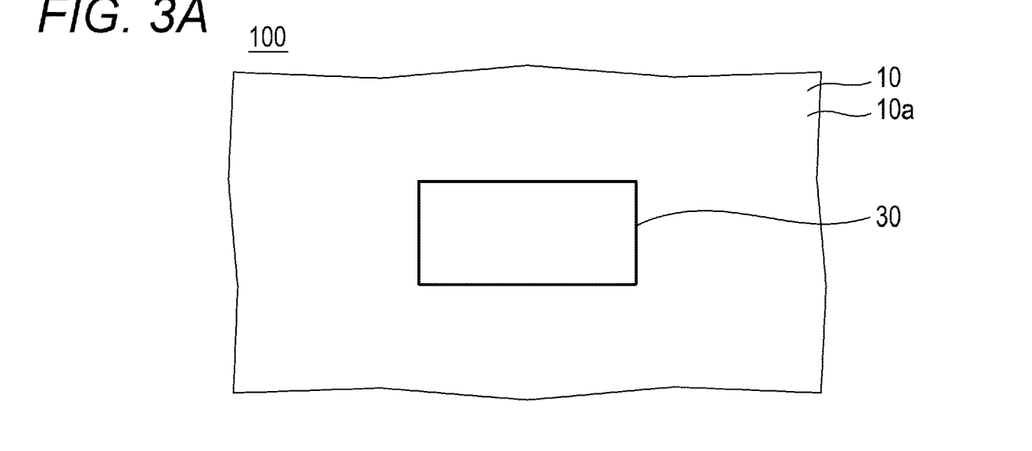
FIGS. 3A, 3B, and 3C are plan views for explaining the method for manufacturing the printed circuit board with electronic component according to the first embodiment.

First, in the mounting step, the substrate 10 on which the conductor pattern 40 is formed is prepared. Then, as illustrated in FIGS. 2A and 3A, the electronic component 30 (square surface mount component) is mounted on the upper surface of the conductor pattern 40, and the electronic component 30 is joined to the conductor pattern 40 by soldering. In more detail, a terminal (not illustrated) is provided on a lower surface of the electronic component 30, and the terminal and a land portion (not illustrated) of the conductor pattern 40 are joined to each other.

Subsequently, in the coating step, as the first coating step, the coating resin is applied over the entire surface (the upper surface and the side peripheral surface) excluding the lower surface of the electronic component 30, and a portion located around the electronic component 30 in the one surface 10a of the substrate 10 and the conductor pattern 40 in a plan view. Note that as described above, from the viewpoint of minimizing the formation range of the coating resin layer 20, the amount of the coating resin applied in the first coating step is preferably the minimum amount required to satisfactorily cover the electronic component 30.

Figure 3B:
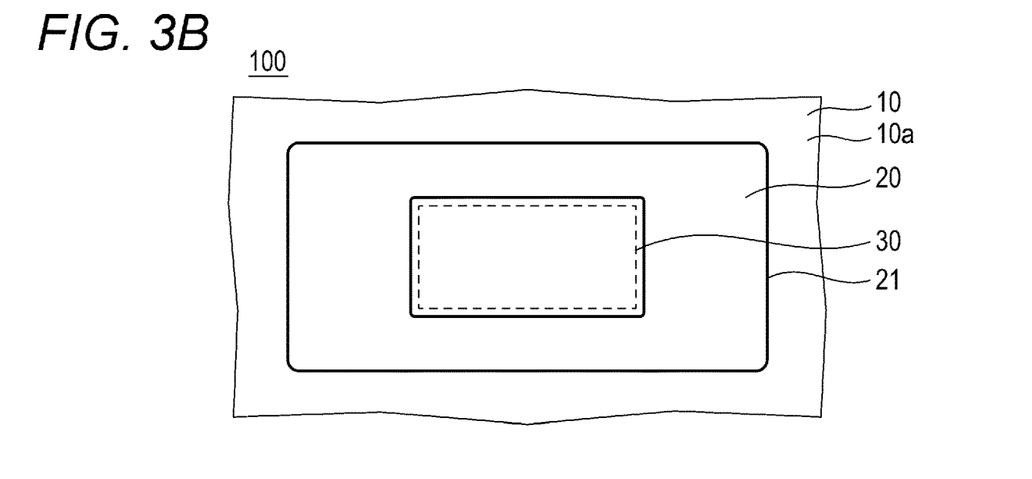

Subsequently, in the first curing step, the coating resin applied in the first coating step is cured to form the coating resin layer 20 made of the first coating resin layer (see FIGS. 2B and 3B).

Note that in the first curing step, the coating resin may be semi-cured or fully cured. Here, semi-curing means a state before the coating resin is completely cross-linked or a state before being completely polymerized, and full curing means a state where the coating resin is completely cross-linked, completely polymerized, or completely dried.

Subsequently, in the second coating step, the coating resin is applied to the coating resin (first coating resin layer) cured in the first curing step.

Note that the amount of the coating resin to be applied in the second coating step is preferably smaller than the amount of the coating resin to be applied in the first coating step. By doing so, it is possible to more reliably restrain the coating resin to be applied in the second coating step from spreading over a wide range on the surface of the coating resin cured in the first curing step, so that the coating resin to be applied in the second coating step can be applied within a desired range. Therefore, the film thickness of the coating resin layer 20 can be increased while reducing the amount of the coating resin to be applied in the second coating step.

Figure 3C:
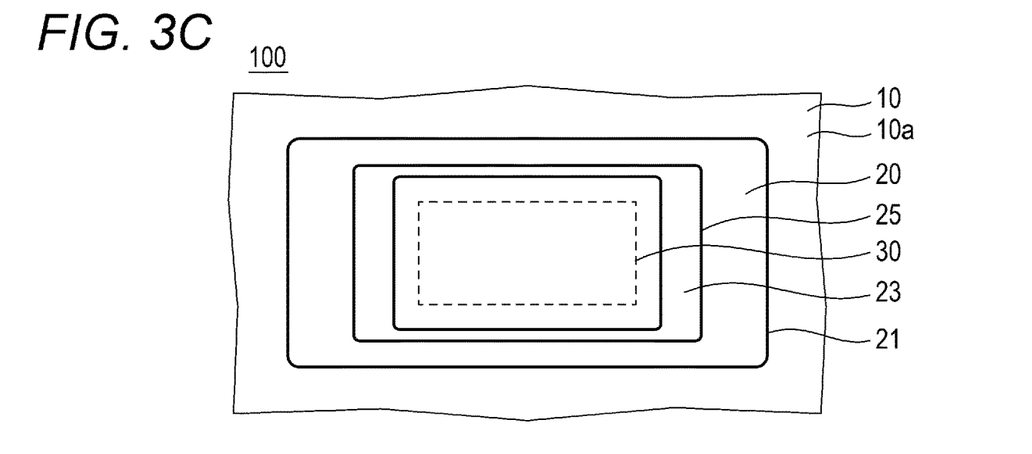

Next, in the second curing step, the coating resin applied in the second coating step is cured to form the coating resin layer 20 made of the first coating resin layer and the second coating resin layer (see FIGS. 2C and 3C).

Note that in the second curing step, for example, only the coating resin applied in the second coating step may be cured. Alternatively, when the coating resin applied in the first coating step is semi-cured, coating resins applied in the first coating step and the second coating step may be completely cured together.

Note that a method for applying the coating resin is not particularly limited, but for example, a dipping method, a brush coating method, a spray method, a drawing coating method, a dispense method, or the like can be used.

Here, in the case of this method, as illustrated in FIGS. 2B, 2C, 3B, and 3C, a range in which the coating resin is applied in the second coating step is the region inside the outline of the coating resin cured in the first curing step in a plan view That is, in the second coating step, the coating resin is applied to a range narrower than the formation range of the coating resin cured in the first curing step.

Thus, the entire coating resin to be applied in the second coating step can be applied to the coating resin cured in the first curing step, so that the film thickness of the coating resin layer 20 can be increased over a wider range.

Further, in the case of this method, in the coating step, the coating resin is applied to coat the entire electronic component 30 (square surface mount components, and the entire electronic component 30 (square surface mount component) is coated with the coating resin layer 20.

Note that "the entire electronic component 30" as used herein is the entire surface of the electronic component 30 exposed from the substrate 10, excluding the surface (one surface 30a) of the electronic component 30 facing the one surface 10a of the substrate 10.

Thus, as described above, the coating resin layer 20 can more reliably protect the electronic component 30 (square surface mount component) from dust, moisture, physical impact, and the like.

In more detail, in the case of this method, as an example, in the first coating step, the coating resin is applied so that the entire electronic component 30 is covered and the electronic component 30 is located at a central portion of the coating resin layer 20. Subsequently, in the second coating step, the coating resin is applied to cover the entire electronic component 30 and to be located mainly in the central portion of the coating resin cured in the first curing step. Thus, the main portion 23 of the coating resin layer 20 and the sub-portion 21 arranged around the main portion 23 are formed, and it is possible to realize a configuration in which the main portion 23 covers the entire electronic component 30. As illustrated in FIG. 3C, the outline of the electronic component 30 is located in the region inside the outline of the main portion 23 of the coating resin layer 20 in a plan view.

Note that in the present disclosure, in the coating step, for example, the coating step of applying the coating resin to at least the part of the electronic component 30 and the curing step of curing the applied coating resin may be repeated three or more times in this order. That is, for example, after the second coating step, as a third coating step, the coating resin may be further applied to the coating resin cured in the second curing step, and subsequently a third curing step may be performed to cure the coating resin. Further, in this case, the coating resin may be semi-cured in the first curing step and the second curing step, and coating resins applied in the first to third coating steps may be completely cured together in the third curing step.

Further, in this method, as an example, the resin material of the coating resin to be applied in the first coating step and the resin material of the coating resin to be applied in the second coating step are made of the same kind of resin material. However, in the present disclosure, the resin material of the coating resin to be applied in the first coating step and the resin material of the coating resin to be applied in the second coating step may be different resin materials from each other. In this case, the resin material of the coating resin to be applied in the first coating step is preferably, for example, a resin material having high wettability (spreadability) with respect to the material constituting the substrate 10. By doing so, the coating resin can be applied thinly and in a required range, so that the amount of the coating resin to be used can be reduced.

Further, the resin material of the coating resin to be applied in the second coating step is preferably, for example, a resin material having low wettability (spreadability) with respect to the cured coating resin. By doing so, it is possible to increase the film thickness of the coating resin layer 20 while satisfactorily covering the entire electronic component 30 with the coating resin layer 20.

Second Embodiment

Next, a second embodiment of the present disclosure will be described with reference to FIGS. 4A to 5C. The printed circuit board 100 with electronic component according to the present embodiment is different from the printed circuit board 100 with electronic component according to the first embodiment described above in the respects described below. In other respects, since it is configured in the same manner as the printed circuit board 100 with electronic component according to the first embodiment, description thereof may be omitted.

In the case of this embodiment, the electronic component 30 has a lead terminal 36. In the coating step, the coating resin is applied to coat at least the lead terminal 36, and the lead terminal 36 is coated with the coating resin layer 20.

Thus, the coating resin layer 20 can satisfactorily protect the lead terminal 36 from dust, moisture, physical impact, and the like.

Figure 4A:
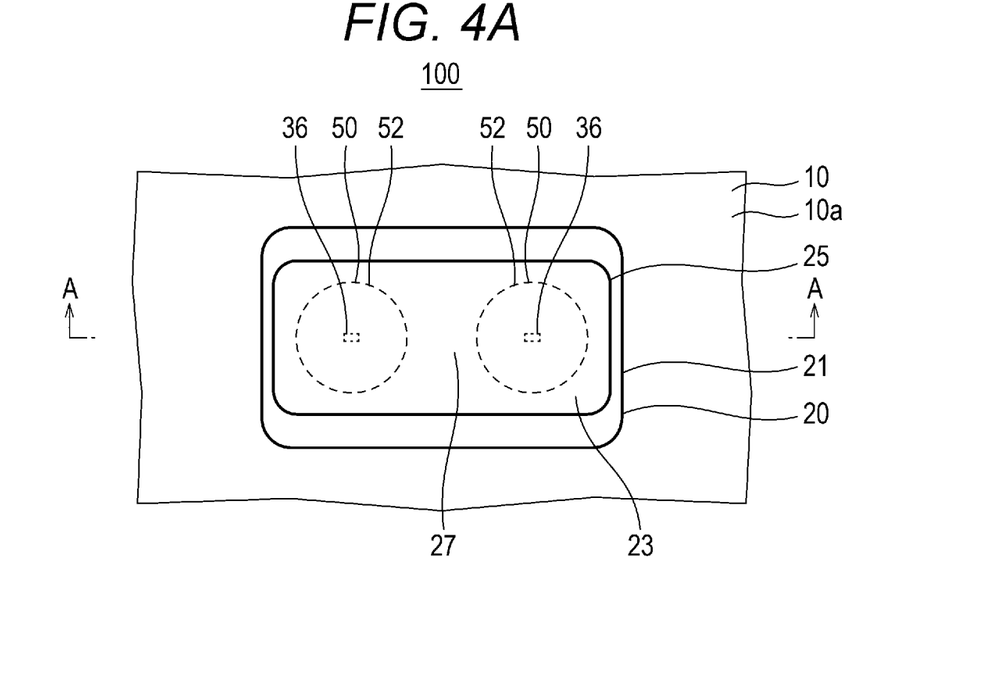
FIG. 4A is a plan view.
Figure 4B:
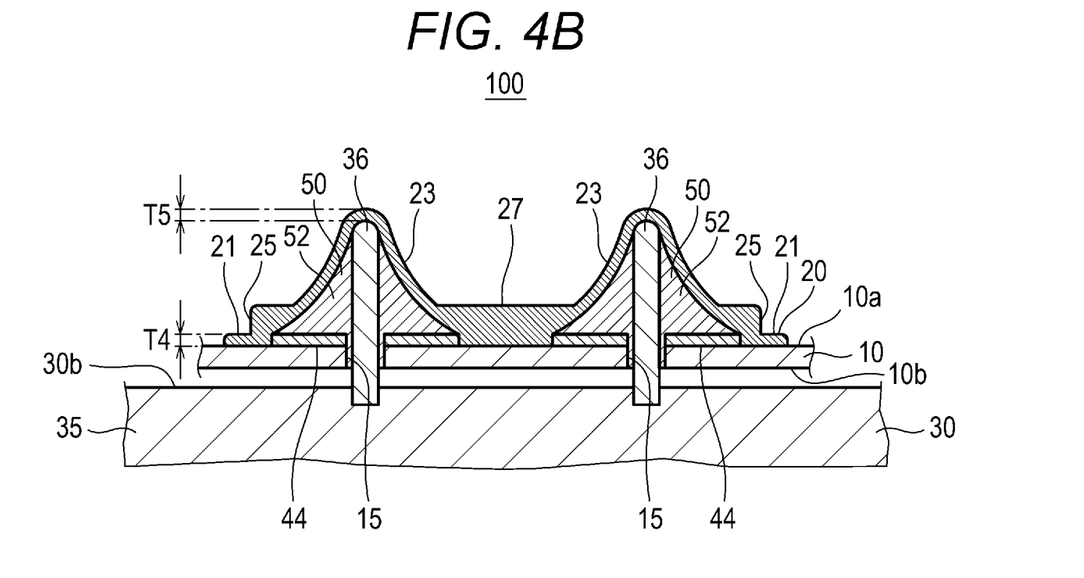
FIG. 4B is a cut end view taken along line A-A illustrated in FIG. 4A.

As illustrated in FIGS. 4A and 4B, in the case of the present embodiment, the electronic component 30 has, for example, a main body portion 35, and a plurality of the lead terminals 36 are provided on the other surface 30b of the main body portion 35. The main body portion 35 of the electronic component 30 is mounted on a surface (hereinafter referred to as the other surface 10b) opposite to the one surface 10a side of the substrate 10. Each lead terminal 36 penetrates the substrate 10 from the other surface 10b side toward the one surface 10a side of the substrate 10.

As illustrated in FIG. 4B, a plurality of through-holes 15 are formed in the substrate 10. Each through-hole 15 penetrates the substrate 10 in a thickness direction thereof. Further, on the one surface 10a of the substrate 10, a land portion 44 connected to the conductor pattern 40 (not illustrated) is formed in a portion corresponding to each through-hole 15, Each land portion 44 is formed, for example, at a peripheral edge portion of an opening on an upper end side of the through-hole 15 in the substrate 10.

One lead terminal 36 is inserted through each through-hole 15. In an example illustrated in FIG. 4B, a lower end portion of the lead terminal 36 projects downward from the through-hole 15, and an upper end portion of the lead terminal 36 projects upward from the through-hole 15. That is, the upper end portion of each lead terminal 36 projects upward from the one surface 10a of the substrate 10.

Here, as in the first embodiment, also in the case of the present embodiment, the coating resin is further applied to the coating resin cured in the first curing step, in the second coating step as will be described below. Therefore, the coating resin can also be satisfactorily and thickly applied to each of such lead terminals 36.

Further, the corresponding lead terminal 36 is joined to the land portion 44 of each through-hole 15 via solder 50. Thus, the electronic component 30 is mounted on the substrate 10 and is electrically connected to the conductor pattern 40 via the solder 50.

In more detail, the solder 50 is, for example, filled to fill a gap between an inner peripheral surface of each land portion 44 and an outer peripheral surface of an intermediate portion of the corresponding lead terminal 36. Further, a fillet 52, which is a solder fillet, is formed along an outer periphery of the upper end portion of the lead terminal 36 and the entire upper end surface of the land portion 44.

Note that the fillet 52 may be formed along the entire outer periphery of the lower end portion of the lead terminal 36. Further, depending on an amount of the solder 50, the fillet 52 may be selectively formed along an upper end surface or a part of the outer periphery of the lower end portion of the lead terminal 36, or the fillet 52 may not be substantially formed.

As illustrated in FIGS. 4A and 4B, the coating resin layer 20 is formed, for example, on the one surface 10a side of the substrate 10, and coats the entire an upper portion of each lead terminal 36 and fillet 52.

Thus, the coating resin layer 20 can satisfactorily protect each lead terminal 36 from dust, moisture, physical impact, and the like.

In the case of the present embodiment, as illustrated in FIG. 4A, an outline of each lead terminal 36 and an outline of each fillet 52 are arranged in the region inside the outline of the coating resin layer 20 in a plan view. Note that the coating resin layer 20 may be, for example, formed to continuously cover each lead terminal 36 and each fillet 52, or may be formed in an island shape for each lead terminal 36 and each fillet 52.

Further, also in the case of the present embodiment, as in the first embodiment, the film thickness of the main portion 23 is larger than that of the sub-portion 21. Further, the step 25 exists at the boundary between the sub-portion 21 and the main portion 23 of the coating resin layer 20.

As illustrated in FIG. 4B, it is a preferred example that a minimum film thickness T5 (see FIG. 4B) of the main portion 23 is larger than a maximum film thickness T4 (see FIG. 4B) of the sub-portion 21. By configuring the film thicknesses of the main portion 23 and the sub-portion 21 in this way, the lead terminal 36 can be more reliably protected from dust, moisture, physical impact, and the like.

However, in the present disclosure, the minimum film thickness T5 of the main portion 23 may be thinner than the maximum film thickness T4 of the sub-portion 21. Even with such a configuration, according to the present embodiment, as described below in the second coating step, the coating resin is applied to the coating resin cured in the first curing step, so that the minimum film thickness T5 of the main portion 23 can be secured satisfactorily. Therefore, the lead terminal 36 can be satisfactorily protected from dust, moisture, physical impact, and the like.

In a plan view, as illustrated in FIG. 4A, it is preferred that all outlines of the lead terminals 36 are arranged in the region inside the outline of the main portion 23 of the coating resin layer 20, and it is more preferred that all outlines of fillets 52 are arranged in the region inside the outline of the main portion 23 of the coating resin layer 20.

Further, a step (recess) (not illustrated) may be formed in an intermediate portion 27, which is the coating resin layer 20 applied between the lead terminals 36.

The minimum film thickness of the sub-portion 21 of the coating resin layer 20 is not particularly limited, but is preferably 10 μm or more, for example.

The minimum film thickness T5 of the main portion 23 of the coating resin layer 20 is not particularly limited, but is preferably 40 μm or more, for example.

Hereinafter, the method for manufacturing the printed circuit board 100 with electronic component according to the present embodiment will be described in more detail with reference to FIGS. 5A to 6C.

Also in the case of the present embodiment, as in the first embodiment, the mounting step of mounting the electronic component 30 on the substrate 10, and the coating step of coating at least the part of the electronic component 30 with the coating resin layer 20 are performed in this order.

The coating step includes the first coating step of applying the coating resin to at least the part of the electronic component 30, the first curing step of curing the coating resin applied in the first coating step, the second coating step of further applying the coating resin to the coating resin cured in the first curing step, and the second curing step of curing the coating resin applied in the second coating step.

Figure 5A:
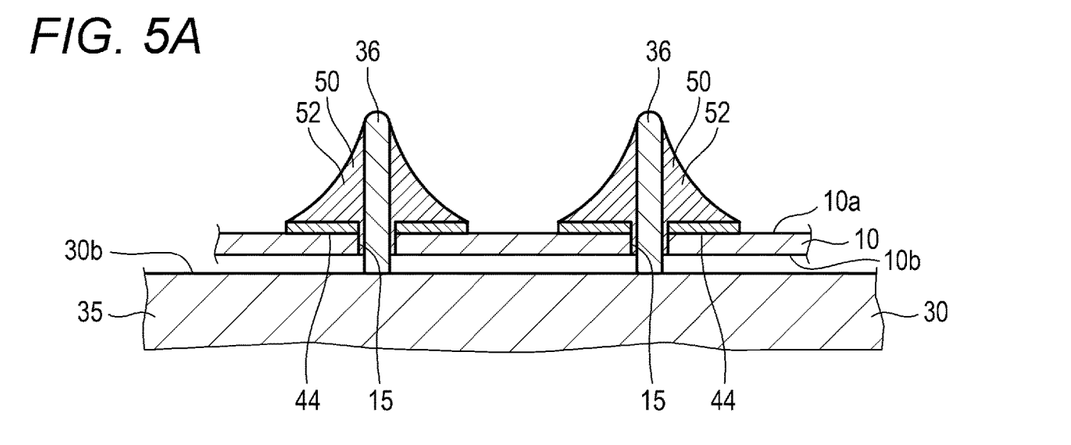
Figure 6A:
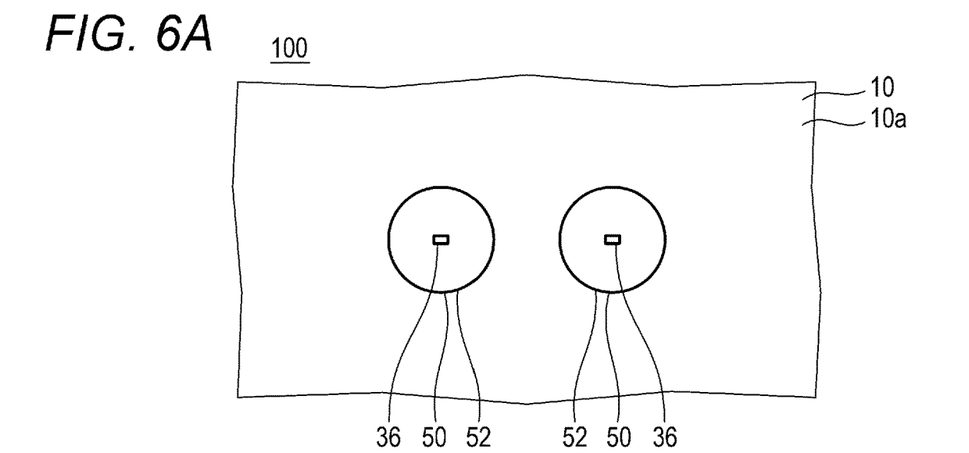
FIGS. 6A, 6B, and 6C are plan views for explaining the method for manufacturing the printed circuit board with electronic component according to the second embodiment.

In more detail, in the case of the present embodiment, first, in the mounting step, the substrate 10 in which the through-holes 15 are formed is prepared. Then, as illustrated in FIGS. 5A and 6A, the corresponding lead terminal 36 is joined to each land portion 44 of each through-hole 15 via the solder 50. In this way, the electronic component 30 is mounted on the substrate 10.

Figure 5B:
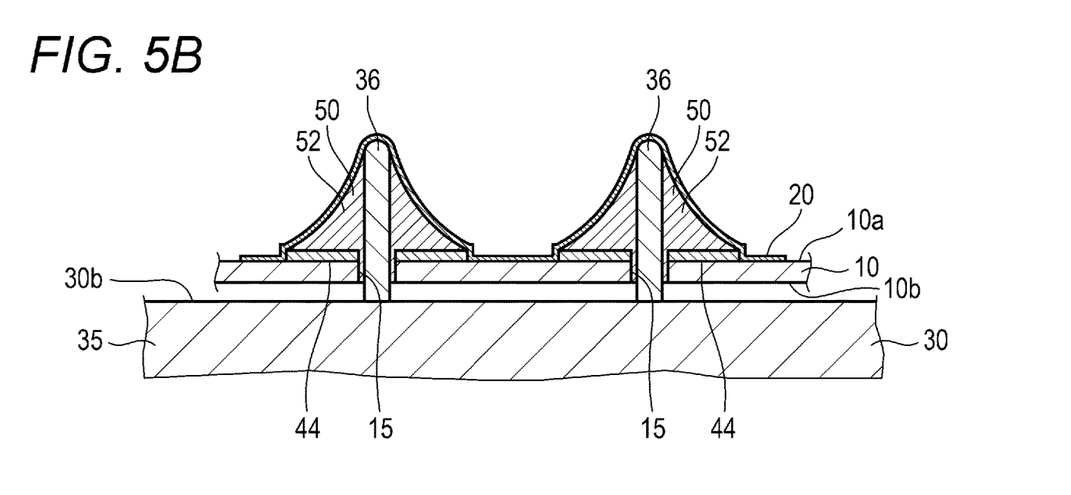
Figure 6B:
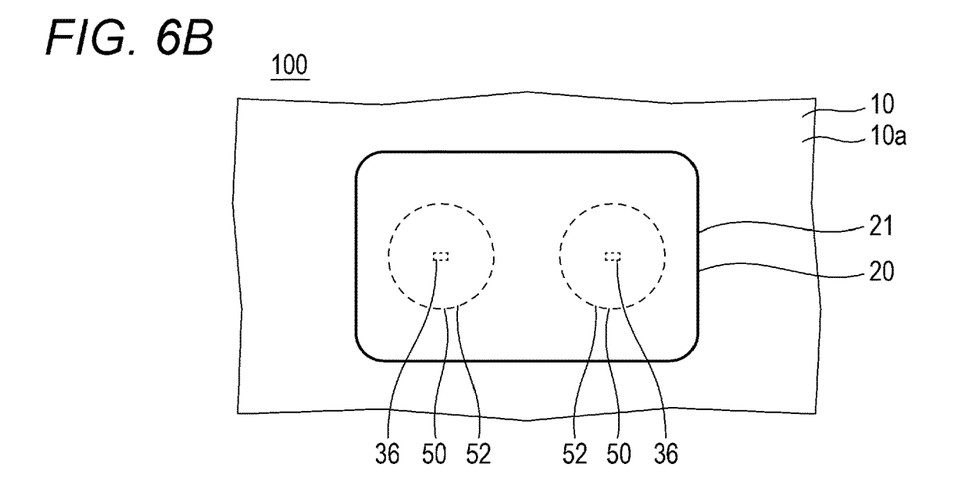

Subsequently, as illustrated in FIGS. 5B and 6B, in the first coating step, the coating resin is applied over each lead terminal 36 and each fillet 52, and the portion located around the electronic component 30 in the one surface 10a of the substrate 10 and the conductor pattern 40 in a plan view. Then, as the first curing step, the coating resin applied in the first coating step is cured.

Figure 5C:
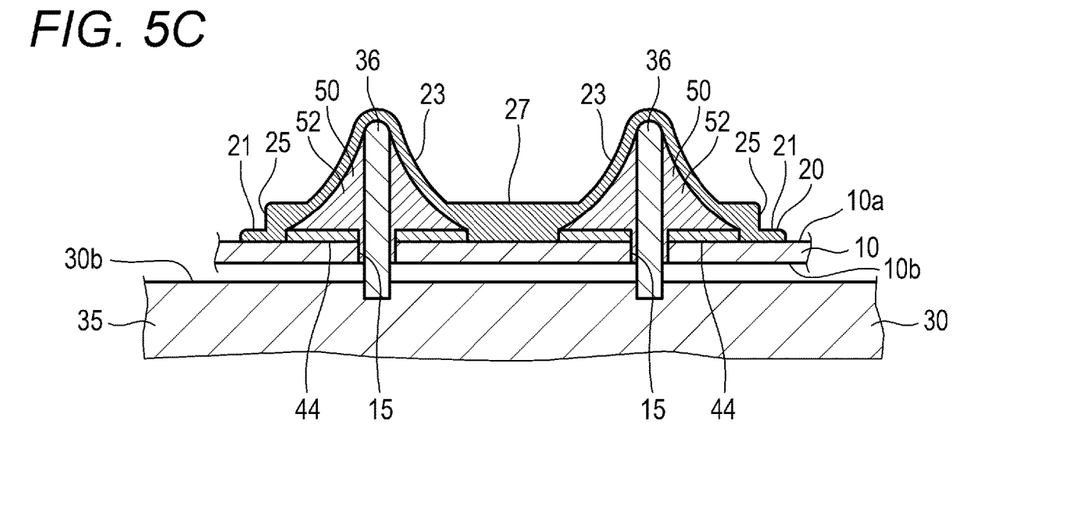
Figure 6C:
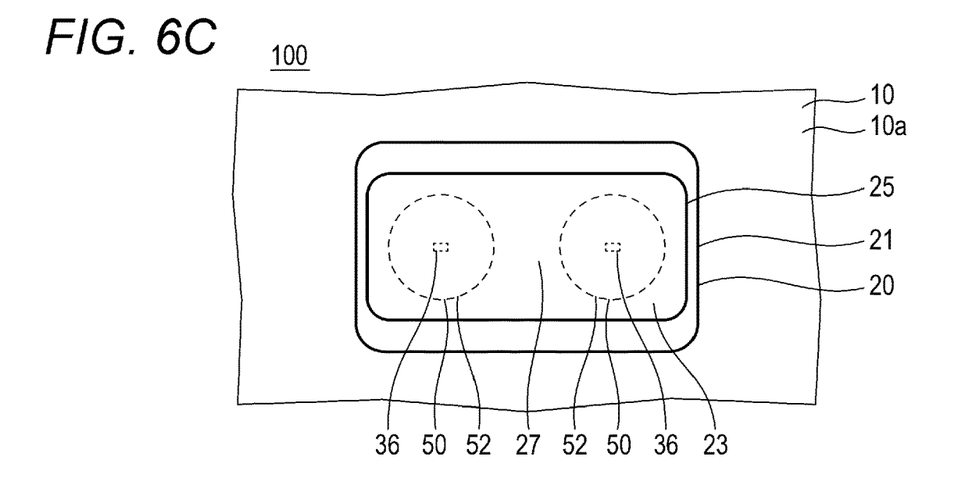

Subsequently, as illustrated in FIGS. 5C and 6C, in the second coating step, the coating resin is further coated on the coating resin cured in the first curing step. Then, in the second curing step, the coating resin applied in the second coating step is cured.

Here, also in the case of the present embodiment, as in the first embodiment, the range in which the coating resin is applied in the second coating step is preferably the region inside the outline of the coating resin cured in the first curing step in a plan view, That is, in the second coating step, it is preferable to apply the coating resin to the range narrower than the formation range of the coating resin cured in the first curing step.

Further, in the coating step, it is preferable to coat the entire fillet 52 (however, excluding a portion in contact with the one surface 10a) with the coating resin layer 20.

In more detail, for example, in the first coating step and the second coating step, the coating resin is applied to cover the entire fillet 52. In a plan view, all the outlines of fillets 52 are located in the region inside the outline of the main portion 23 of the coating resin layer 20.

Note that when the upper end portion of the lead terminal 36 is exposed from the fillet 52 as in an example illustrated in FIGS. 5A and 6A, in the coating step, the entire upper end portion of the lead terminal 36 exposed from the fillet 52 is preferably coated with the coating resin layer 20.

Modification of Second Embodiment

Next, a modification of the second embodiment will be described with reference to FIGS. 7A and 7B.

The printed circuit board 100 with electronic component according to this modification is different from the printed circuit board 100 with electronic component according to the second embodiment described above in the respects described below. In other respects, since it is configured in the same manner as the printed circuit board 100 with electronic component according to the second embodiment, the description thereof may be omitted.

Figure 7A:
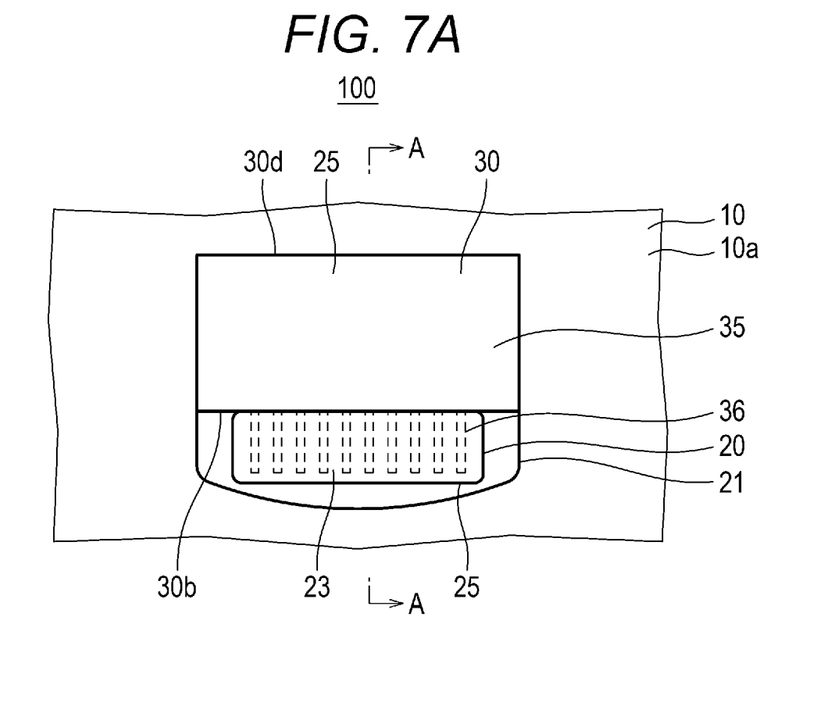
FIG. 7A is a plan view.
Figure 7B:
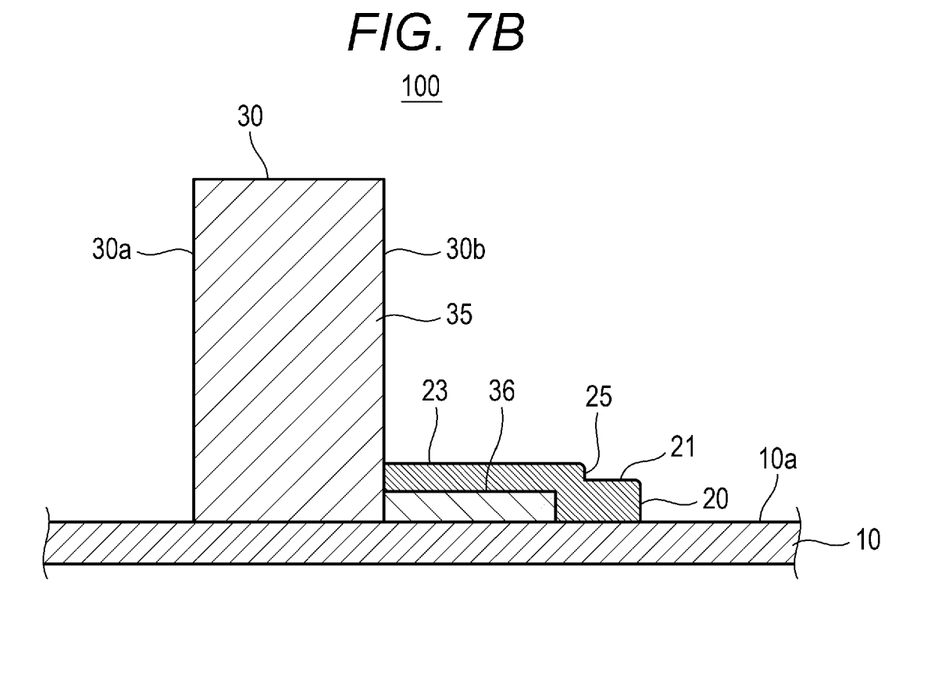
FIG. 7B is a cut end view taken along line A-A illustrated in FIG. 7A.

As illustrated in FIGS. 7A and 7B, this modification is different from the second embodiment in that the main body portion 35 of the electronic component 30 is mounted on the one surface 10a side of the substrate 10.

In more detail, the main body portion 35 of the electronic component 30 is arranged, for example, in a sideways posture on the one surface 10a of the substrate 10. The other surface 30b of the main body portion 35 provided with the lead terminals 36 faces in a horizontal direction (a direction perpendicular to an up-down direction) in a plan view (see FIG. 7A), and extends in the up-down direction in a sectional view (see FIG. 7B). Further, the lead terminals 36 are arranged, tier example, side by side in the horizontal direction in a plan view (see FIG. 7A), and extend horizontally along the one surface 10a of the substrate 10 in a sectional view (see FIG. 7B).

Then, the coating resin layer 20 is formed, for example, on the one surface 10a side of the substrate 10, and coats the upper portion of each lead terminal 36.

Even with such a configuration, the coating resin layer 20 can satisfactorily protect each lead terminal 36 from dust, moisture, physical impact, and the like.

Also in the case of this modification, in the plan view, all the outlines of the lead terminals 36 are arranged in the region inside the outline of the coating resin layer 20. In an example illustrated in FIG. 7A, the main portion 23 of the coating resin layer 20 is formed to continuously cover the lead terminals 36. On the other hand, the main body portion 35 is, for example, exposed from the coating resin layer 20 in a plan view. Further, a part of the coating resin layer 20 is in contact with, for example, the other surface 30b of the main body portion 35. Note that the coating resin layer 20 may also cover an upper portion of the main body portion 35, for example.

Although each embodiment has been described above with reference to the drawings, these are examples of the present disclosure, and various configurations other than the above can be employed.

The "coating resin applied in the first coating step" and the "coating resin applied in the second coating step" in the above description may be respectively referred to as the "first coating resin" and the "second coating resin". Similarly, the "coating resin cured in the first curing step" and the "coating resin cured in the second curing step" may be respectively referred to as a "cured first coating resin" and a "cured second coating resin.

The embodiments of the present disclosure include the following first to fourth methods for manufacturing the printed circuit board with electronic component, and the following fifth and sixth printed circuit boards with electronic component.

As a feature of the first method for manufacturing a printed circuit board with electronic component, the first method includes: mounting an electronic component on an insulating substrate; applying an insulating first coating resin to at least a part of the electronic component; curing the first coating resin; applying Insulating second coating resin to the cured first coating resin; and curing the second coating resin.

As a feature of the second method for manufacturing the printed circuit board with electronic component according to the first method for manufacturing the printed circuit board with electronic component, a range in which the second coating resin is applied is a region inside an outline of the cured first coating resin in a plan view.

As a feature of the third method for manufacturing the printed circuit board with electronic component according to the first or second method for manufacturing the printed circuit board with electronic component, the electronic component is a square surface mount component, and the first and second coating resins are applied to coat the entire square surface mount component.

As a feature of the fourth method for manufacturing the printed circuit board with electronic component according to the first or second method for manufacturing the printed circuit board with electronic component, the electronic component has a lead terminal, and the first and second coating resins are applied to coat at least the lead terminal.

As a feature of the fifth printed circuit board with electronic component, the fifth printed circuit board includes: an insulating substrate; an electronic component mounted on the substrate; and an insulating coating resin layer, the coating resin layer has a main portion covering at least a part of the electronic component and a sub-portion arranged around the main portion, and a film thickness of the main portion is larger than that of the sub-portion, and there is a step at a boundary between the main portion and the sub-portion.

As a feature of the sixth printed circuit board with electronic component according to the fifth printed circuit board with electronic component, a thickness of the step is larger than that of the sub-portion.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A method for manufacturing a printed circuit board with electronic component, comprising:
   mounting an electronic component on an insulating substrate;
   applying an insulating first coating resin to at least a part of the electronic component;
   curing the first coating resin;
   applying an insulating second coating resin to the cured first coating resin, wherein a step is formed by the insulating second coating resin at a boundary between the insulating first coating resin and the insulating second coating resin; and
   curing the second coating resin.

2. The method for manufacturing the printed circuit board with electronic component according to claim 1, wherein the electronic component is a square surface mount component, and
   the first and second coating resins are applied to coat the entire square surface mount component.

3. The method for manufacturing the printed circuit board with electronic component according to claim 1, wherein
   the electronic component has a lead terminal, and
   the first and second coating resins are applied to coat at least the lead terminal.

4. The method for manufacturing the printed circuit board with electronic component according to claim 1, wherein the insulating first coating resin and the insulating second coating resin are electrically insulating.

5. A method for manufacturing a printed circuit board with electronic component, comprising:
   mounting an electronic component on an insulating substrate;
   applying an insulating first coating resin to at least a part of the electronic component;
   curing the first coating resin;
   applying an insulating second coating resin to the cured first coating resin, wherein a range in which the second coating resin is applied is a region inside an outline of the cured first coating resin in a plan view; and
   curing the second coating resin.

6. A printed circuit board with electronic component, comprising:
   an insulating substrate;
   an electronic component mounted on the substrate; and
   an insulating coating resin layer, wherein
   the coating resin layer has a main portion covering at least a part of the electronic component and a sub-portion arranged around the main portion, and
   a film thickness of the main portion is larger than that of the sub-portion, and a step is formed by the main portion at a boundary between the main portion and the sub-portion.

7. The printed circuit board with electronic component according to claim 6, wherein a thickness of the step is larger than that of the sub-portion.

8. The printed circuit board with electronic component according to claim 6, wherein the insulating coating resin layer is electrically insulating.

9. The printed circuit board with electronic component according to claim 6, wherein the sub-portion extends outwardly from the step.

10. The printed circuit board with electronic component according to claim 6, wherein the sub-portion extends outwardly from the step from a lower surface of the step.

* * * * *